US009711948B2

(12) United States Patent
Belkin et al.

(10) Patent No.: US 9,711,948 B2
(45) Date of Patent: Jul. 18, 2017

(54) TERAHERTZ QUANTUM CASCADE LASER IMPLEMENTING A ČERENKOV DIFFERENCE-FREQUENCY GENERATION SCHEME

(71) Applicant: Board of Regents, The University of Texas System, Austin, TX (US)

(72) Inventors: Mikhail Belkin, Austin, TX (US); Robert Adams, Austin, TX (US); Markus Christian Amann, Garching (DE); Augustinas Vizbaras, Garching (DE)

(73) Assignee: Board of Regents, The University of Texas System, Austin, TX (US)

( * ) Notice: Subject to any disclaimer, the term of this patent is extended or adjusted under 35 U.S.C. 154(b) by 1163 days.

(21) Appl. No.: 13/949,379

(22) Filed: Jul. 24, 2013

(65) Prior Publication Data
US 2016/0308331 A1 Oct. 20, 2016

Related U.S. Application Data

(60) Provisional application No. 61/674,968, filed on Jul. 24, 2012.

(51) Int. Cl.
*H01S 5/20* (2006.01)
*H01S 5/18* (2006.01)
(Continued)

(52) U.S. Cl.
CPC ............ *H01S 5/2031* (2013.01); *B82Y 20/00* (2013.01); *H01S 5/0208* (2013.01); *H01S 5/18* (2013.01);
(Continued)

(58) Field of Classification Search
CPC .......... H01S 5/00; H01S 5/026; H01S 5/0625; H01S 5/1053; H01S 5/22
See application file for complete search history.

(56) References Cited

U.S. PATENT DOCUMENTS

| 5,588,015 A | * | 12/1996 | Yang | ...................... | B82Y 20/00 257/22 |
| 7,974,325 B2 | | 7/2011 | Belkin et al. | | |
| 2003/0043877 A1 | | 3/2003 | Kaspi | | |

OTHER PUBLICATIONS

'Terahertz sources based on Cerenkov difference-frequency generation in quantum cascade lasers to Vijayraghavan, K et al. , 2012.*
(Continued)

*Primary Examiner* — Dung Nguyen
(74) *Attorney, Agent, or Firm* — Baker Botts L.L.P.

(57) ABSTRACT

A terahertz source implementing a Čerenkov difference-frequency generation scheme in a quantum cascade laser. The laser includes an undoped or semi-insulating InP substrate with an exit facet that is polished at an angle between 10° to 40°. The laser further includes a first waveguide cladding layer(s) in contact with an active layer (arranged as a multiple quantum well structure) and a current extraction layer on top of the substrate. Furthermore, the laser includes a second waveguide cladding layer(s) on top of the active layer, where the first and second waveguide cladding layers are disposed to form a waveguide structure by which terahertz radiation generated in the active layer is guided inside the laser. The terahertz radiation is emitted into the substrate at a Čerenkov angle relative to a direction of the nonlinear polarization wave in the active layer, and once in the substrate, propagates towards the exit facet.

12 Claims, 4 Drawing Sheets

(51) Int. Cl.
  *H01S 5/34*  (2006.01)
  *B82Y 20/00*  (2011.01)
  *H01S 5/02*  (2006.01)
  *H01S 5/343*  (2006.01)
  *H01S 5/06*  (2006.01)
  *H01S 5/10*  (2006.01)
  *H01S 5/042*  (2006.01)

(52) U.S. Cl.
  CPC .......... H01S 5/3401 (2013.01); H01S 5/3402 (2013.01); H01S 5/34313 (2013.01); H01S 5/34346 (2013.01); *H01S 5/0421* (2013.01); *H01S 5/0604* (2013.01); *H01S 5/1085* (2013.01); *H01S 2301/145* (2013.01); *H01S 2302/02* (2013.01)

(56) References Cited

OTHER PUBLICATIONS

Vijayraghavan et al., "Terahertz Sources Based on Čerenkov Difference-Frequency Generation in Quantum Cascade Lasers," Applied Physics Letters 100, 251104, Jun. 20, 2012.

Adams et al., "THz Quantum Cascade Sources Based on Intra-Cavity Frequency Mixing," IRMMW-THz 2011 Conference, Oct. 5, 2011.

Vijayraghavan et al., "Broadly Tunable Terahertz Generation in Mid-Infrared Quantum Cascade Lasers," Nature Communications, Jun. 17, 2013.

Austerer et al., "Čerenkov-type phase-matched second-harmonic emission from GaAs/AlGaAs Quantum-Cascade Lasers," Applied Physics Letters 92, 111114, Mar. 21, 2008.

Belkin et al., "Room Temperature Terahertz Quantum Cascade Laser Source Based on Intracavity Difference-Frequency Generation," Applied Physics Letters, vol. 92, 201101, May 19, 2008.

Belkin et al., "Terahertz Quantum-Cascade-Laser Source Based on Intracavity Difference-Frequency Generation," Nature Photonics, vol. 1, May 1, 2007.

International Search Report and Written Opinion for International Application No. PCT/US13/51780 dated Dec. 20, 2013, pp. 1-9.

Vijayraghavan et al., "Terahertz Sources Based on Cerenkov Difference-Frequency Generation in Quantum Cascade Lasers," Applied Physics Letters, 100, Jun. 20, 2012, pp. 251104-1 to 251104-4.

International Preliminary Report on Patentability for International Application No. PCT/US2013/051780 dated Feb. 5, 2015, pp. 1-7.

\* cited by examiner

TERAHERTZ QUANTUM CASCADE LASER IMPLEMENTING A ČERENKOV DIFFERENCE-FREQUENCY GENERATION SCHEME

CROSS-REFERENCE TO RELATED APPLICATIONS

This application is related to the following commonly owned U.S. Patent Application:

Provisional Application Ser. No. 61/674,968, "Short-Wavelength Quantum Cascade Laser Sources Based on Quasi-Phase-Matched Intra-Cavity Second-Harmonic Generation with Efficient Frequency Conversion," filed Jul. 24, 2012, and claims the benefit of its earlier filing date under 35 U.S.C. §119(e).

GOVERNMENT INTERESTS

The U.S. Government has certain rights in this invention pursuant to the terms of National Science Foundation Grant No. ECCS-0925217.

TECHNICAL FIELD

The present invention relates generally to quantum cascade lasers, and more particularly to a terahertz source based on a quantum cascade laser implementing a Čerenkov difference-frequency generation scheme thereby allowing for terahertz radiation to be efficiently extracted along the whole length of the quantum cascade laser waveguide resulting in an improvement in terahertz power output and terahertz conversion efficiency and producing a directional terahertz beam.

BACKGROUND

Quantum Cascade Lasers (QCLs) are semiconductor lasers that emit in the mid- to far-infrared portion of the electromagnetic spectrum. Quantum cascade lasers are unipolar semiconductor lasers that utilize optical transitions between confined electronic sub-bands (e.g., conduction or valence bands) of semiconductor heterostructures. As a result, the emitted photon energy is determined by the thicknesses of the wells and barriers and can be tailored by bandgap engineering.

Specifically, a quantum cascade laser includes a periodic series of thin layers of varying material composition forming a superlattice in its optically active region. The superlattice introduces a varying electric potential across the length of the device, meaning that there is a varying probability of electrons occupying different positions over the length of the device. This is referred to as one-dimensional multiple quantum well confinement and leads to the splitting of the band of permitted energies into a number of discrete electronic subbands. By suitable design of the layer thicknesses, it is possible to engineer a population inversion between two subbands in the system under applied bias which is required in order to achieve laser emission. Since the position of the energy levels in the system is primarily determined by the layer thicknesses and not the material, it is possible to tune the emission wavelength of quantum cascade lasers over a wide range in the same material system.

Additionally, in a unipolar quantum cascade laser, once an electron has undergone an intersubband transition and emitted a photon in one period of the superlattice, it can tunnel into the next period of the structure where another photon can be emitted. This process of a single electron causing the emission of multiple photons as it traverses through the quantum cascade laser structure gives rise to the name cascade and makes a quantum efficiency of greater than unity possible which leads to higher output powers than conventional semiconductor laser diodes.

The terahertz frequency range, which may be loosely defined as the wavelengths between 30 and 300 µm, has historically been characterized by a relative lack of convenient radiation sources, detectors and transmission technology. It remains one of the least developed spectral regions, although a surge of activity in the past decade has advanced its potential for applications including, but not limited to, astrophysics and atmospheric science, biological and medical sciences, security screening and illicit material detection, non-destructive evaluation, communications technology, high resolution remote imaging, and ultrafast spectroscopy.

However, the development of terahertz systems has been slow principally related to the source technology. Currently, there does not exist room-temperature, high-power, widely-tunable terahertz sources that are compact, inexpensive and suitable for production in large quantities. The power generated by solid-state electronic devices rolls off with frequency owing to transit-time and resistance-capacitance effects. As a result, the available power generated above 1 terahertz is well below the milliwatt level. Compact electrically-pumped terahertz photonic devices are limited to p-doped Germanium lasers that require strong magnetic fields and cryogenic cooling for operation and terahertz quantum cascade lasers that achieve population inversion between two electron subbands spaced by THz photon energies. While terahertz quantum cascade lasers have achieved remarkable progress over the past decade, there still requires cryogenic cooling thereby greatly diminishing the usefulness of such lasers.

An alternative approach to THz quantum cascade laser source design is based on nonlinear terahertz Difference-Frequency Generation (DFG) inside of a dual-wavelength mid-infrared quantum cascade laser. Such devices are referred to as THz DFG-QCLs in the following. The active region in these devices is designed to provide mid-infrared emission at two different frequencies and to have giant optical nonlinearity, associated with intersubband transitions, for difference-frequency generation processes inside of the laser cavity. The design of these devices is described in M. A. Belkin, F. Capasso, A. Belyanin, D. L. Sivco, A. Y. Cho, D. C. Oakley, C. J. Vineis, and G. W. Turner, "Terahertz quantum-cascade-laser source based on intracavity difference-frequency generation," Nature Photonics 1, 288-292 (May 2007) and M. A. Belkin, F. Capasso, F. Xie, A. Belyanin, M. Fischer, A. Wittmann, and J. Faist, "Room temperature terahertz quantum cascade laser source based on intracavity difference-frequency generation," Appl. Phys. Lett. 92(20), 201101-1-201101-3 (May 2008) and is patented as M. A. Belkin, F. Capasso, and A. Belyanin, "Methods and apparatus for generating terahertz radiation," U.S. Pat. No. 7,974,325, issued Jul. 5, 2011.

These THz DFG-QCLs have previously demonstrated THz emission at room temperature. Their waveguide was designed to provide confinement for both mid-IR and THz radiation and was tailored to achieve modal phase-matching for efficient nonlinear frequency generation. However, these devices only provide relatively small THz power output and are highly inefficient as approximately 99% of all THz radiation generated inside of their laser cavity is lost due to absorption in the laser active region.

BRIEF SUMMARY

In one embodiment of the present invention, a terahertz quantum cascade laser comprises a substrate, where an exit facet of the substrate is polished at an angle between 10° to 40°. The laser further comprises a doped current extraction semiconductor layer positioned on the substrate. Additionally, the laser comprises an active region layer positioned above the current extraction semiconductor layer, where the active region layer is arranged as a multiple quantum well structure, where the current extraction semiconductor layer is used for lateral current extraction from the active region layer. Furthermore, the laser comprises a metallic contact electrically connected to the current extraction semiconductor layer for current extraction from the active region layer. The laser further comprises a first one or more waveguide cladding layers between the current extraction semiconductor layer and the action region layer. The laser additionally comprises a second one or more waveguide cladding layer in contact with and above the active region layer, where the first and second one or more waveguide cladding layers are disposed to form a waveguide structure to guide mid-infrared light. In addition, the laser comprises metal contact layers in contact with the second one or more waveguide cladding layers. A propagation constant of a nonlinear polarization wave ($k_{nl}$), given by a difference between propagation constants of mid-infrared pumps in the waveguide structure, in the active region layer is smaller compared to a propagation constant of a terahertz radiation ($k_{THz}$) propagating in the substrate. The terahertz radiation is emitted into the substrate at a Čerenkov angle relative to a direction of the nonlinear polarization wave, where the terahertz radiation once in the substrate propagates towards the exit facet.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWINGS

A better understanding of the present invention can be obtained when the following detailed description is considered in conjunction with the following drawings, in which.

DETAILED DESCRIPTION

To solve the problem of THz radiation absorption in the THz DFG-QCL waveguide one could use Čerenkov DFG scheme for THz generation in which THz radiation is emitted an angle to mid-infrared pumps so that THz radiation can be collected along the whole length of the laser. As described in K. Vijayraghavan, R. W. Adams, A. Vizbaras, M. Jang, C. Grasse, G. Boehm, M. C. Amann, and M. A. Belkin "Terahertz Sources Based on Čerenkov Difference-Frequency Generation in Quantum Cascade Lasers," *Appl. Phys. Lett.*, 100, 251104 (2012), Čerenkov emission in DFG-QCLs occurs when the group effective refractive index of the QCL waveguide for mid-IR pumps is smaller than the refractive index for THz radiation in the device substrate. Furthermore, it has been realized that Čerenkov THz emission will happen naturally in InGaAs/AlInAs/InP THz DFG-QCLs grown on an undoped or semi-insulating InP substrates.

More specifically the refractive index of InP in mid-infrared ($\lambda$=3-15 µm) is approximately 3.0, which is lower than the mid-infrared refractive index of InGaAs/AlInAs QCL active region ($\approx$3.2). This means that InP works as a suitable waveguide cladding material for mid-infrared QCLs. However, due to the presence of phonon absorption at approximately 9-10 THz in InP, the refractive index of semi-insulating or undoped InP in the 1-8 THz range is larger than 3.5, which allows for Čerenkov emission.

It is important to note that undoped or semi-insulating InP substrates have low THz loss. In contrast, doped InP substrates typically used for InGaAs/AlInAs/InP QCLs have low refractive index in THz due to free electron gas effect and also have high optical loss at THz frequencies. Thus standard THz DFG-QCLs grown in doped InP substrates, similar to the ones described in M. A. Belkin, F. Capasso, and A. Belyanin, "Methods and apparatus for generating terahertz radiation," U.S. Pat. No. 7,974,325, issued Jul. 5, 2011 would not be suitable for Čerenkov THz emission.

The present invention provides an elegant and simple solution for efficient extraction of terahertz radiation along the whole length of the laser waveguide in THz QCL sources. As a result, the power output of the THz QCL sources may be boosted by up to 100 times or more.

Figure 1:
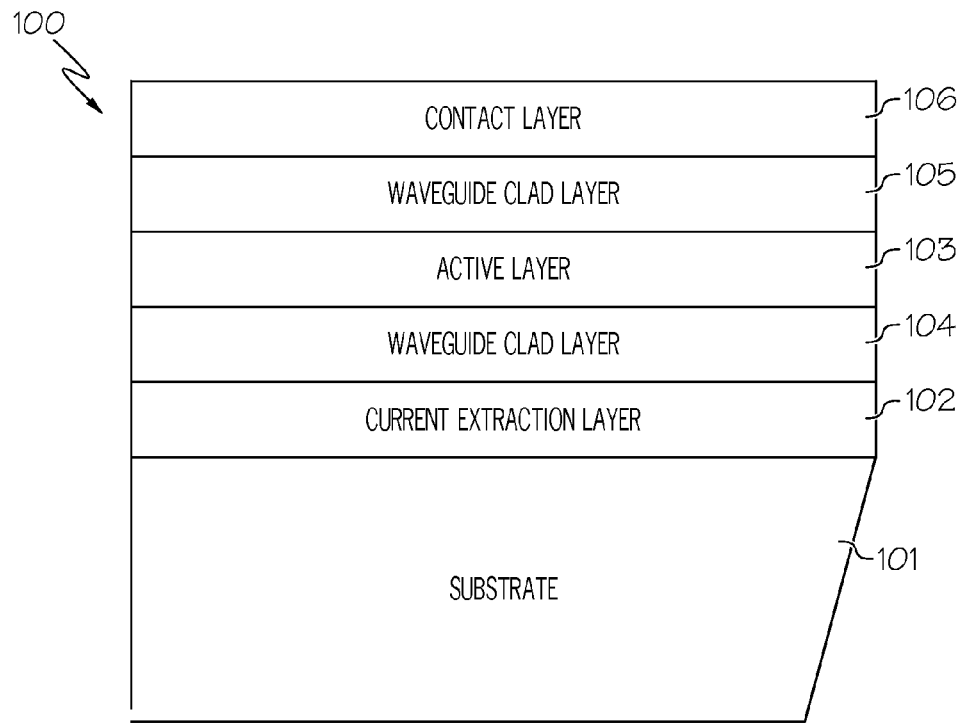
FIG. 1 illustrates a quantum cascade laser in accordance with an embodiment of the present invention.
Figure 2:
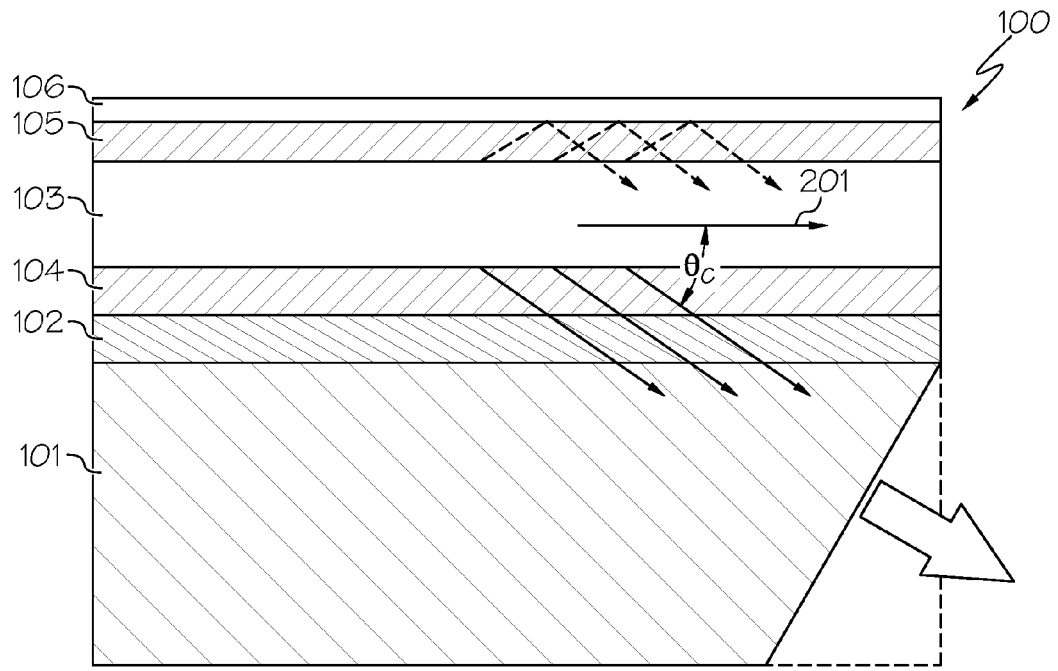
FIG. 2 illustrates the Čerenkov terahertz radiation emitted into the substrate or towards the top contact layer and reflected to the substrate in accordance with an embodiment of the present invention.
Figure 3:
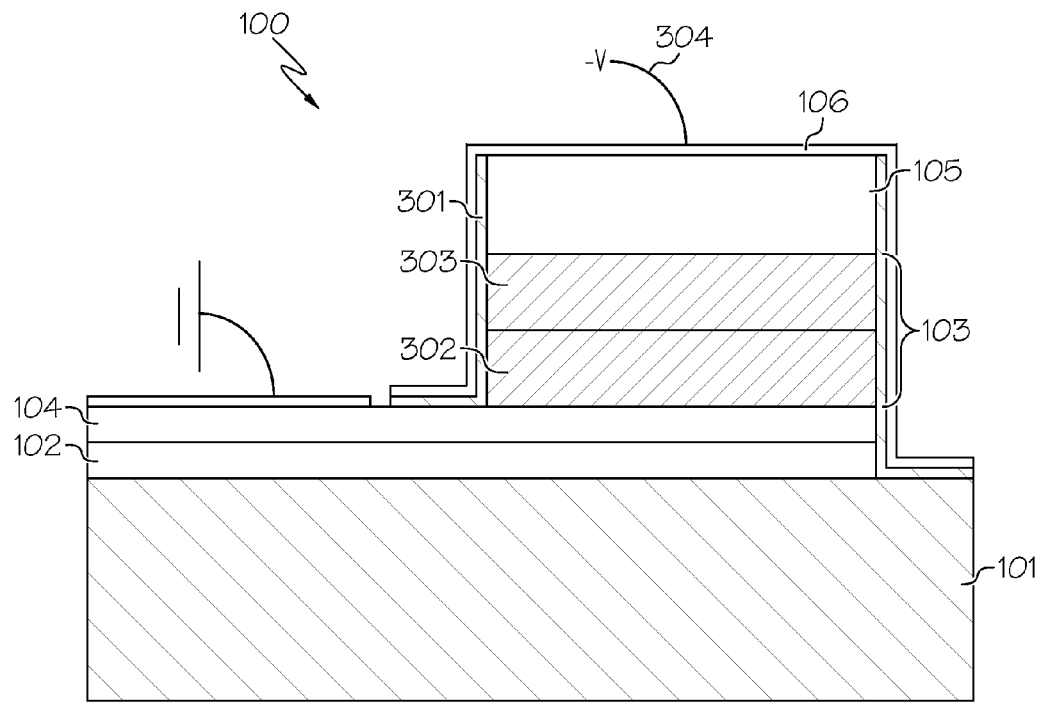
FIG. 3 illustrates a facet-view schematic of the quantum cascade laser in accordance with an embodiment of the present invention.
Figure 4:
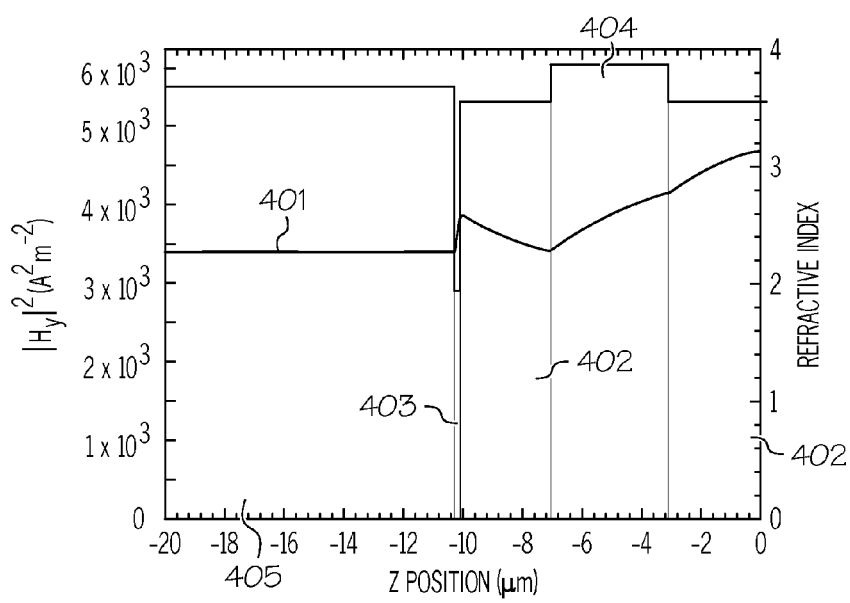
FIG. 4 is a graph illustrating the calculated squared magnitude of the H-field for the TM-polarized Čerenkov wave ($|H_y|^2$) for the devices of the present invention along with the refractive index profile for the case of 4 THz emission in accordance with an embodiment of the present invention.
Figure 5:
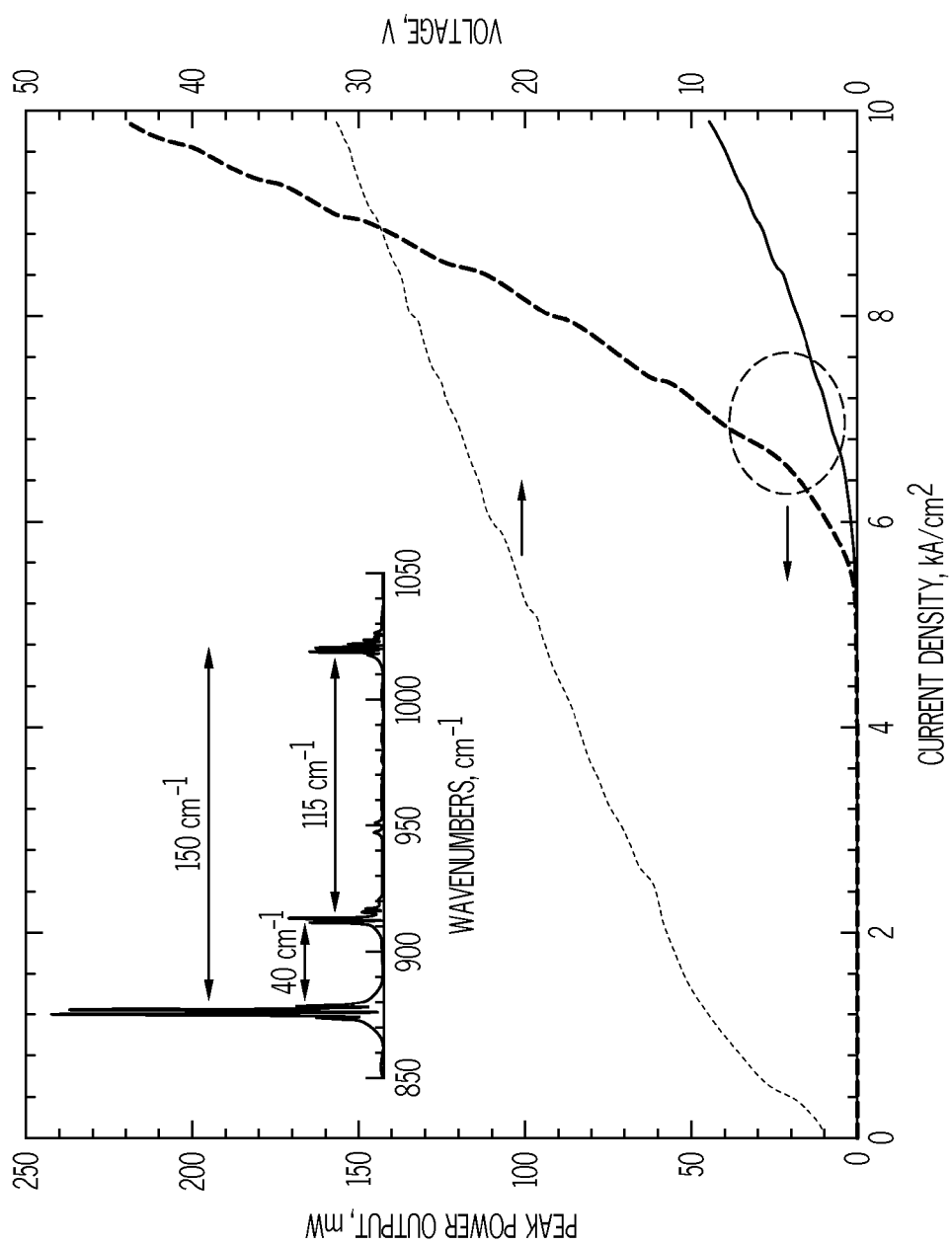
FIG. 5 is a graph illustrating the light output-current density and the current density-voltage characteristics of a 1-mm-long laser with a high-reflection back facet coating in accordance with an embodiment of the present invention.
Figure 6A:
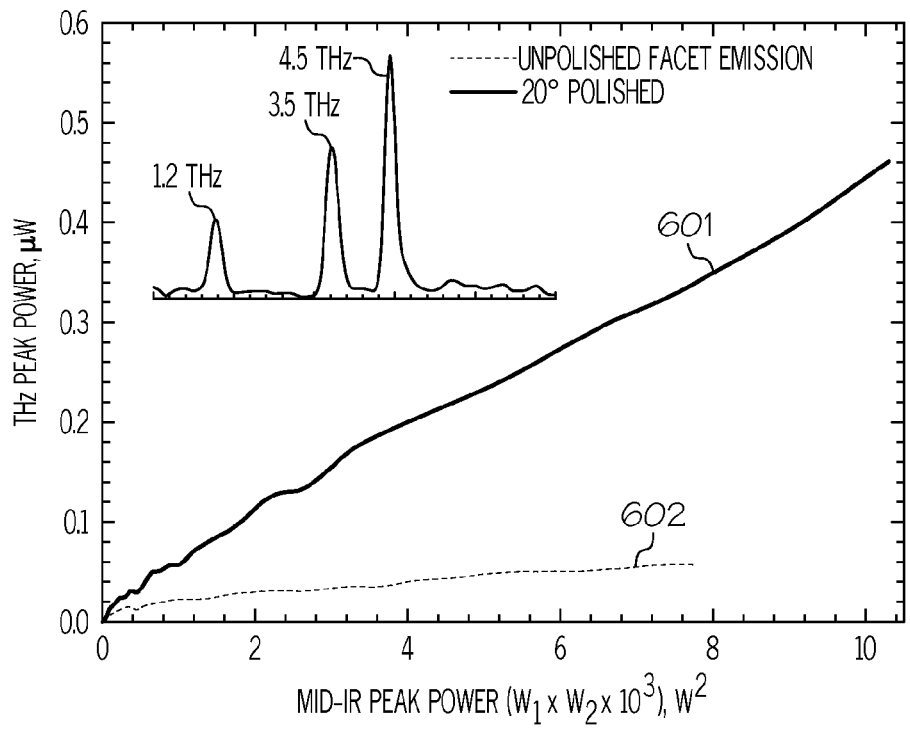
FIG. 6A is a graph illustrating the room temperature terahertz emission spectrum for a quantum cascade laser with a substrate polished at 200 and for a quantum cascade laser with an unpolished substrate in accordance with an embodiment of the present invention.
Figure 6B:
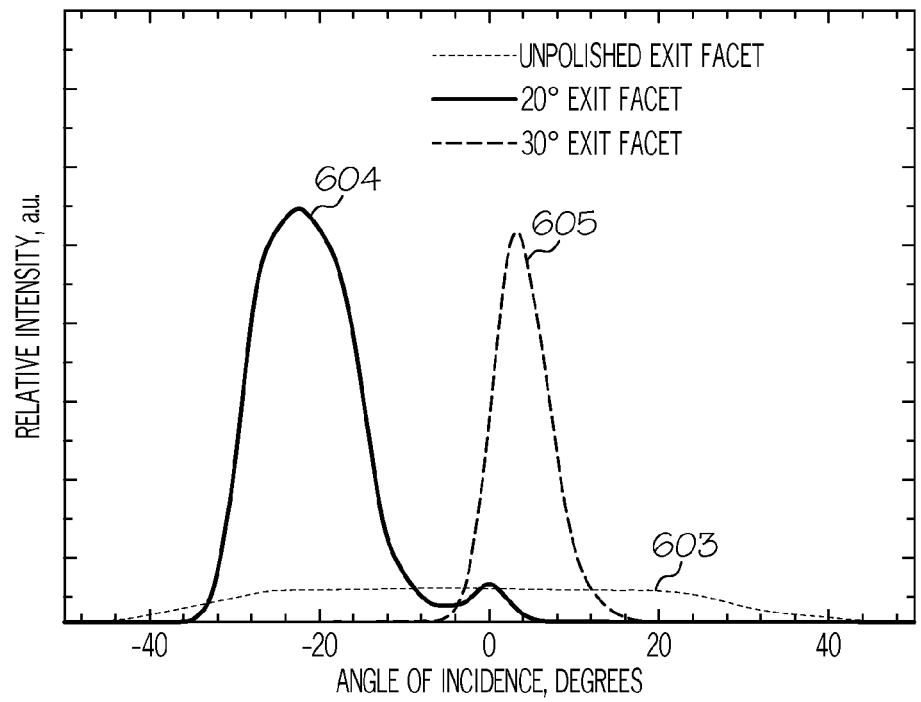
FIG. 6B is a graph illustrating the far-field emission profiles of quantum cascade lasers with a substrate polished at 200, a substrate polished at 30° and an unpolished substrate in accordance with an embodiment of the present invention.

The principles of the present invention provide a room-temperature electrically-pumped terahertz semiconductor laser with wide tunability and milliwatt-level power output using an intra-cavity Čerenkov difference-frequency generation scheme to efficiently extract terahertz radiation along the whole length of the quantum cascade laser waveguide and produce terahertz quantum cascade laser sources with broadband directional terahertz output as discussed below in connection with FIGS. 1-5 and 6A-6B. FIG. 1 illustrates a quantum cascade laser. FIG. 2 illustrates the Čerenkov terahertz radiation emitted into the substrate or towards the top contact layer and reflected to the substrate. FIG. 3 illustrates a facet-view schematic of the quantum cascade laser. FIG. 4 is a graph illustrating the calculated squared magnitude of the H-field for the TM-polarized Čerenkov wave ($|Hy|^2$) for the devices of the present invention along with the refractive index profile for the case of 4 THz emission. FIG. 5 is a graph illustrating the light output-current density and the current density-voltage characteristics of a 1-mm-long laser with a high-reflection back facet coating. FIG. 6A is a graph illustrating the room temperature terahertz emission spectrum for a quantum cascade laser with a substrate polished at 200 and for a quantum cascade laser with an unpolished substrate. FIG. 6B is a graph illustrating the far-field emission profiles of quantum cascade lasers with a substrate polished at 200, a substrate polished at 30° and an unpolished substrate.

Referring now to the Figures in detail, FIG. 1 illustrates a quantum cascade laser 100 in accordance with an embodiment of the present invention. Quantum cascade laser 100 includes a semiconductor substrate 101 that may be comprised of a III-V semiconductor compound, such as InP (indium phosphide). In one embodiment, substrate 101 is formed of semi-insulating or undoped indium phosphide. Quantum cascade laser 100 further includes a doped current extraction semiconductor layer 102 positioned on substrate 101. Furthermore, quantum cascade laser 100 includes an active region layer 103 surrounded by waveguide clad layers 104, 105. As will be discussed further herein, current extraction layer semiconductor layer 102 is used for lateral current extraction from active region layer 103. In one embodiment, current extraction layer 102 and waveguide clad layer(s) 104 are the same layer. Waveguide clad layers 104, 105 are disposed to form a waveguide structure to guide mid-infrared light by which terahertz radiation generated in active region layer 103 is guided inside laser 100. Furthermore, quantum cascade laser 100 includes metal contact layer(s) 106 (e.g., gold material) on top of the upper side of waveguide clad layer(s) 105.

Active region layer 103 is a semiconductor layer that generates light of a predetermined wavelength (for example, light in the mid-infrared wavelength range) and provide giant optical nonlinearity for terahertz difference-frequency generation by making use of intersubband transitions in a quantum well structure. In the present embodiment, in correspondence to the use of an InP substrate 101 as the semiconductor substrate, active region layer 103 is arranged as a InGaAs/AlInAs multiple quantum well structure that uses InGaAs in quantum well layers and uses AlInAs in quantum barrier layers.

Specifically, active region layer 103 is formed, by multiple repetitions of a quantum cascade structure in which the light emitting layers and electron injection layers are laminated. The number of quantum cascade structure repetitions in the active region is set suitably and is, for example, approximately 10-60 for mid-infrared QCLs and THz DFG-QCLs.

As will be discussed in further detail below, substrate 101, as shown in FIG. 1, is polished closed to normal to the Čerenkov terahertz beam direction to avoid total internal reflection of the terahertz beam. A brief discussion of the Čerenkov terahertz difference-frequency generation emission is deemed appropriate here. Čerenkov terahertz difference-frequency generation emission occurs when the nonlinear polarization wave propagates at a higher phase velocity compared to that of the terahertz radiation in the surrounding material. In terms of propagation constants, this means that the propagation constant of the nonlinear polarization wave ($k_{nl}$) is smaller compared to that of the terahertz radiation ($k_{THz}$). In this case, the generated radiation is emitted at the Čerenkov angle:

$$\theta_C = \cos^{-1}(k_{nl}/k_{THz}) \qquad \text{(EQ 1)}$$

relative to the direction of $k_{nl}$, as shown schematically in FIG. 2 (nonlinear polarization wave 201 of FIG. 2). FIG. 2 illustrates the Čerenkov terahertz radiation emitted into substrate 101 as shown with arrows in accordance with an embodiment of the present invention. As also shown in FIG. 2, the Čerenkov terahertz radiation may be emitted towards top contact layer 106 (shown with dashed arrows) and reflected to substrate 101.

In the case of difference-frequency generation in quantum cascade lasers, the propagation constant of nonlinear polarization wave 201 in active region layer 103 is given as $|\beta_{\omega 1} - \beta_{\omega 2}|$, where $\beta_{\omega i} = n_{eff}(\omega_i)\omega_i/c$ with $n_{eff}(\omega_i)$ being the effective refractive index of the mid-IR pump mode at frequency $\omega_i$ (i=1,2). Since the two mid-IR pump frequencies are close, $\omega_1 \approx \omega_2$, one can write $$|\beta_1 - \beta_2| \approx (n_g \omega_{THz})/c, \qquad \text{(EQ 2)}$$

where $$n_g = n_{eff}(\omega_1) + \omega_1 \frac{\partial n_{eff}}{\partial \omega}\bigg|_{\omega=\omega_1}$$

is the group effective refractive index at $\omega_1$ and $\omega_{THz} = \omega_1 - \omega_2$ is the terahertz difference-frequency. In order to produce Čerenkov difference-frequency generation emission into substrate 101, the substrate refractive index at $\omega_{THz}$ is larger than $n_g$. This condition is satisfied throughout the 1-8 terahertz spectral range for InP/GaInAs/AlInAs quantum cascade lasers grown on semi-insulating or undoped InP. As a result, efficient broadband terahertz quantum cascade laser sources based on Čerenkov difference-frequency generation can be implemented.

The schematic of proof-of-principle devices is shown in FIG. 3. FIG. 3 illustrates a facet-view schematic of quantum cascade laser 100 in accordance with an embodiment of the present invention. Quantum cascade laser 100 of FIG. 3 further illustrates using a semi-insulating InP substrate 101 as well as using a lateral current extraction scheme. Quantum cascade laser 100 includes a current extraction semiconductor layer 102 (e.g., InGaAs layer lattice-matched to InP with n-doping n=7×10$^{17}$ cm$^{-3}$) positioned between substrate 101 and active region layer 103 via waveguide clad layer(s) 104. In one embodiment, waveguide clad layer(s) 104 and current extraction layer 102 may be the same layer.

Furthermore, quantum cascade laser 100 of FIG. 3 includes an insulating layer 301 as shown in FIG. 3. Furthermore, FIG. 3 illustrates that active region layer 103 includes two sections 302, 303 designed to emit mid-IR pumps at $\omega_1$ and $\omega_2$, respectively.

Additionally, quantum cascade laser 100 of FIG. 3 includes a metallic contact 304 electrically connected to current extraction layer 102 for current extraction from active region layer 103.

The calculated squared magnitude of the H-field for the TM-polarized Čerenkov wave ($|Hy|^2$) for the devices of the present invention is shown in FIG. 4 along with the refractive index profile for the case of 4 THz emission in accordance with an embodiment of the present invention. The structure of the THz DFG-QCL reported in K. Vijayraghavan, Y. Jiang, M. Jang, A. Jiang, K. Choutagunta, A. Vizbaras, F. Demmerle, G. Boehm, M. C. Amman, and M. A. Belkin "Broadly tunable terahertz generation in mid-infrared quantum cascade lasers," Nature Communications 4, 2021 (2013) is used as an example here. Referring to FIG. 4, in conjunction with FIGS. 1-3, FIG. 4 illustrates the H-field in the TM-polarized THz Čerenkov waves (line 401) and waveguide refractive index profiles at 4 THz, where cladding layers 104, 105 are shown in region 402, current injection layer 102 is shown in region 403, active region layer 103 is shown in region 404 and substrate 101 is shown in region 405 for contact layer 106 positioned at z=0.

In mid-IR, the refractive index of substrate 101 is low and allows for good mode confinement. In the 1-8 terahertz range, due to the Reststrahlenband at 8-10 terahertz, the refractive index of undoped InP is high and the Čerenkov condition is fulfilled. The waveguide calculations for the lasers of the present invention (laser 100 with various polishing angles as discussed further below) give $n_g \approx 3.37$ in mid-IR. Given the refractive index of undoped InP of more than 3.5 in 1-8 THz range and is virtually independent of frequency in 1-5 terahertz range, one can obtain a Čerenkov angle $\theta_C \approx 20°$ for the difference-frequency generation in the 1-5 terahertz range. Once in substrate 101, terahertz radiation propagates towards the facet. Since undoped or semi-insulating InP has low loss over 1-5 terahertz, the Čerenkov emission scheme allows for efficient extraction of terahertz radiation along the whole length of the quantum cascade laser waveguide. To avoid total internal reflection of the terahertz Čerenkov wave at the front facet, the exit facet of substrate 101 may be polished at a 10°-40° angle as shown in FIGS. 1 and 2.

Referring now to FIGS. 1-3 in combination, in one embodiment, the lasers of the present invention (laser 100 with various polishing angles as discussed further below) were grown by molecular beam epitaxy on 350 μm thick semi-insulating InP substrates 101. In one embodiment, the thickness of substrate 101 may be between 100 μm and 3,000 μm. In one embodiment, the thickness of substrate 101 is less than 100 μm or more than 3,000 μm. In one embodiment, InGaAs/AlInAs heterostructures lattice-matched to InP was used. In another embodiment, strain-compensated InGaAs/AlInAs heterostructures on InP may be used. The laser active region 103 may consist of many repetitions of the QCL stages designed to provide mid-infrared emission and incorporating optical nonlinearity. In one embodiment, active region 103 may consist of 33 "bound-to-continuum" QCL stages with integrated optical nonlinearity and 27 repetitions of the "double-phonon resonance" QCL stages, separated by a 100 nm thick InGaAs spacer region doped to $n=5\times10^{16}$ cm$^{-3}$. In one embodiment, top cladding layer(s) 105 consists of 3.5 μm thick InP n-doped to $1\times10^{16}$ cm$^{-3}$ followed by a 200 nm thick InP n-doped to $2\times10^{18}$ cm$^{-3}$. In one embodiment, bottom cladding layer(s) 104 consist of 3.5 μm thick indium phosphide n-doped to $1\times10^{16}$ cm$^{-3}$ and current extraction layer 102 comprises an approximately 200 nm thick InGaAs layer n-doped to $1\times10^{18}$ cm$^{-3}$.

In one embodiment, the material may be processed into 35 μm wide ridge waveguides via dry etching. In one embodiment, the sidewalls of the ridges may be insulated with a 600 nm thick layer of SiN, followed by a Ti/Pt/Au (30 nm/60 nm/1000 nm) contact layer deposition. FIG. 3 shows the cross section of the processed ridge laser in accordance with an embodiment of the present invention. In one embodiment, the wafer may be then cleaved into laser bars with 0.1-mm-long or longer devices. In one embodiment, a high reflectivity coating of $Al_2O_3$/Ti/Au (100 nm/5 nm/50 nm) may be evaporated onto the back facets of the devices. In one embodiment, the 350 μm thick InP substrate 101 associated with the exit facet of the device 100 may be mechanically polished to the desired angle with a combination of silicon carbide (SiC) lapping compound and $Al_2O_3$ lapping film Proof-of-principle results of the device operation are shown in FIG. 5 for a 1 mm long laser 100 (FIGS. 1-3) with substrate 101 (FIGS. 1-3) polished at 200 in accordance with an embodiment of the present invention in accordance to the results published in K. Vijayraghavan, R. W. Adams, A. Vizbaras, M. Jang, C. Grasse, G. Boehm, M. C. Amann, and M. A. Belkin "Terahertz Sources Based on Čerenkov Difference-Frequency Generation in Quantum Cascade Lasers," Appl. Phys. Lett., 100, 251104 (2012). The mid-IR emission was observed at two groups of frequencies centered around 1020 cm$^{-1}$ ($\lambda_1$=9.8 μm) and 900 cm$^{-1}$ ($\lambda_2$=11.1 μm) as shown in the inset of FIG. 5. Experimentally, the mid-IR pump wavelengths are slightly longer compared to the design wavelengths of 8.9 and 10.5 μm. Power measurements were performed using bandpass filters to separate two groups of frequencies. The results are shown in FIG. 5 along with the current-voltage characteristic of laser 100. It is emphasized that the mid-IR pumps are unaffected by substrate polishing since the ridge facet and mid-IR waveguide structure remains intact during polishing. The improvement in the terahertz power output is thus entirely due to improved outcoupling of terahertz radiation. The room temperature terahertz emission spectrum of the same device is displayed in FIG. 6A in accordance with an embodiment of the present invention. Specifically, FIG. 6A illustrates the room-temperature terahertz peak power output versus the product of mid-IR pump powers for laser 100 (FIGS. 1-3) with substrate 101 (FIGS. 1-3) polished at 200 (see line 601) and laser 100 (FIGS. 1-3) with an unpolished substrate (not shown in prior Figures) (see line 602). The emission spectrum shows three terahertz peaks in perfect agreement with the mid-IR pump frequency spacing shown in FIG. 5. Because of the large emitter area (whole laser waveguide), the Čerenkov terahertz wave is expected to be well-collimated in the direction normal to the waveguide layers. FIG. 6B illustrates the far-field terahertz emission profiles of three devices: 1 mm long lasers with the substrate output facet as cleaved (vertical) (see line 603), polished at 20° (see line 604) and polished at 30° (see line 605) in accordance with an embodiment of the present invention. The lasers were operated at 80 K with a current density of 9.6 kA/cm$^2$. The far field pattern of the unpolished sample is very broad and weak. In these lasers, the Čerenkov wave experiences total internal reflection, and only optical nonlinearity near the exit facet contributes to terahertz output. Contrastingly, the samples polished to 20° and 30° had highly directional emission and strong output. For the case of 20° polishing, a sharp emission peak approximately 22.5° below normal incidence is seen. In the case of 30° polishing, the beam emits almost normal to the exit facet of the ridge, with a peak 7° above normal incidence. In both cases, taking into account the refraction that occurs at the air-semiconductor interface, this corresponds to an internal emission angle at approximately 20.5° which is in good agreement with the theoretical value of $\theta_C \approx 21°$ Difference in the widths of the emission profiles in the case of 20° and 30° polishing in FIG. 6B is likely due to curvature or other artifacts of the polished facet introduced during manual polishing.

FIG. 6A displays the terahertz power output for two samples: one with an unpolished exit facet and the other one with exit facet polished to 20° in accordance with an embodiment of the present invention. High resistivity silicon hyperhemisphere lenses were affixed to the terahertz exit facet for both devices. The unpolished sample produced peak terahertz power output of only 0.07 µW at 300 K, which corresponds to a mid-IR to terahertz conversion efficiency of ≈7 µW/W². The 20° polished sample produced 0.5 µW of terahertz output power at 300 K, which corresponds to a conversion efficiency of ≈45 µW/W², which is approximately a factor of 10 above the conversion efficiencies in prior designed multi-mode terahertz difference-frequency generation quantum cascade lasers. More detailed analysis of power distribution in mid-IR pumps and terahertz output may be performed by integrating areas below peaks in mid-IR spectra (FIG. 5) and terahertz spectra (FIG. 6A). This analysis yields conversion efficiencies of 70, 40, and 8.4 µW/W² for terahertz emission lines at 3.3, 4.5, and 1.2 terahertz respectively.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A terahertz quantum cascade laser comprising:
a substrate, wherein an exit facet of said substrate is polished at an angle between 10° to 40°;
a doped current extraction semiconductor layer positioned on said substrate;
an active region layer positioned above said current extraction semiconductor layer, wherein said active region layer is arranged as a multiple quantum well structure, wherein said current extraction semiconductor layer is used for lateral current extraction from said active region layer;
a metallic contact electrically connected to said current extraction semiconductor layer for current extraction from said active region layer;
a first one or more waveguide cladding layers between said current extraction semiconductor layer and said action region layer;
a second one or more waveguide cladding layer in contact with and above said active region layer, wherein said first and second one or more waveguide cladding layers are disposed to form a waveguide structure to guide mid-infrared light; and
metal contact layers in contact with said second one or more waveguide cladding layers;
wherein a propagation constant of a nonlinear polarization wave ($k_{nl}$), given by a difference between propagation constants of mid-infrared pumps in said waveguide structure, in said active region layer is smaller compared to a propagation constant of a terahertz radiation ($k_{THz}$) propagating in said substrate, wherein said terahertz radiation is emitted into said substrate at a Čerenkov angle relative to a direction of said nonlinear polarization wave, wherein said terahertz radiation once in said substrate propagates towards said exit facet.

2. The terahertz quantum cascade laser as recited in claim 1, wherein said Čerenkov angle is equal to: $\cos^{-1}(k_{nl}/k_{THz})$.

3. The terahertz quantum cascade laser as recited in claim 1, wherein said active region layer comprises two sections designed to emit mid-IR pumps at $\omega_1$ and $\omega_2$, wherein said $\omega_1$ and $\omega_2$ are two different mid-IR pump frequencies.

4. The terahertz quantum cascade laser as recited in claim 3, wherein a refractive index of said substrate at a terahertz difference-frequency ($\omega_{THz}$) is larger than a group refractive index ($n_g$) at a mid-infrared frequency $\omega$, wherein said $$n_g(\omega) = n_{eff}(\omega) + \omega \frac{dn_{eff}}{d\omega} n_g,$$

wherein said $n_{eff}(\omega)$ is an effective refractive index of a mid-infrared pump mode at said frequency $\omega$ and is approximately the same for two mid-infrared pumps at said frequencies $\omega_1$ and $\omega_2$, wherein said $\omega_{THz}=\omega_1-\omega_2$.

5. The terahertz quantum cascade laser as recited in claim 1, wherein said nonlinear polarization wave propagates at a higher phase velocity compared to said terahertz radiation in said substrate.

6. The terahertz quantum cascade laser as recited in claim 1, wherein said active region layer is arranged as a InGaAs/AlInAs multiple quantum well structure, wherein said active region layer uses said InGaAs in quantum well layers and uses said AlInAs in quantum barrier layers.

7. The terahertz quantum cascade laser as recited in claim 1, wherein said substrate is formed of semi-insulating or undoped indium phosphide.

8. The terahertz quantum cascade laser as recited in claim 1, wherein said metal contact layers are formed of gold.

9. The terahertz quantum cascade laser as recited in claim 1, wherein one of said second one or more waveguide cladding layers in contact with said active region layer comprises an approximately 3.5 µm thick indium phosphide n-doped to $1\times10^{16}$ cm$^{-3}$ followed by an 34 approximately 200 nm thick indium phosphide n-doped to $2\times10^{18}$ cm$^{-3}$.

10. The terahertz quantum cascade laser as recited in claim 1, wherein one of said first one or more waveguide cladding layers below said active region layer comprises an approximately 3.5 µm thick indium phosphide n-doped to $1\times10^{16}$ cm$^{-3}$ and said current extraction semiconductor layer comprises an approximately 200 nm thick InGaAs layer n-doped to $1\times10^{18}$ cm$^{-3}$.

11. The terahertz quantum cascade laser as recited in claim 1, wherein said substrate is between 100 µm and 3,000 µm thick.

12. The terahertz quantum cascade laser as recited in claim 1, wherein said substrate is less than 100 µm and more than 3,000 µm thick.

* * * * *